United States Patent
Tsuchida et al.

(10) Patent No.: US 12,247,297 B2
(45) Date of Patent: Mar. 11, 2025

(54) MULTILAYER FILM STRUCTURE AND METHOD FOR PRODUCING SAME

(71) Applicants: TOSOH CORPORATION, Shunan (JP); National Institute for Materials Science, Tsukuba (JP)

(72) Inventors: Yuya Tsuchida, Ayase (JP); Yuya Suemoto, Ayase (JP); Yoshihiro Ueoka, Ayase (JP); Masami Mesuda, Ayase (JP); Hideto Kuramochi, Ayase (JP); Takahiro Nagata, Tsukuba (JP); Liwen Sang, Tsukuba (JP); Toyohiro Chikyow, Tsukuba (JP)

(73) Assignees: TOSOH CORPORATION, Shunan (JP); National Institute for Materials Science, Tsukuba (JP)

( * ) Notice: Subject to any disclaimer, the term of this patent is extended or adjusted under 35 U.S.C. 154(b) by 0 days.

(21) Appl. No.: 17/772,972

(22) PCT Filed: Oct. 27, 2020

(86) PCT No.: PCT/JP2020/040216
§ 371 (c)(1),
(2) Date: Apr. 28, 2022

(87) PCT Pub. No.: WO2021/085411
PCT Pub. Date: May 6, 2021

(65) Prior Publication Data
US 2024/0158954 A1  May 16, 2024

(30) Foreign Application Priority Data

Oct. 31, 2019 (JP) ................................ 2019-198886
Aug. 24, 2020 (JP) ................................ 2020-140980

(51) Int. Cl.
*H01L 21/02* (2006.01)
*C23C 14/00* (2006.01)
(Continued)

(52) U.S. Cl.
CPC .......... *C23C 28/04* (2013.01); *C23C 14/0036* (2013.01); *C23C 14/021* (2013.01);
(Continued)

(58) Field of Classification Search
CPC ................ C23C 14/0617; C23C 14/35; H01L 21/02458; H01L 21/0254; H01L 21/02631;
(Continued)

(56) References Cited

U.S. PATENT DOCUMENTS 6,045,626 A  4/2000  Yano et al.
2004/0159854 A1  8/2004  Koinuma et al.
(Continued)

FOREIGN PATENT DOCUMENTS

JP  4-164895 A  6/1992
JP  11-260835 A  9/1999
(Continued)

OTHER PUBLICATIONS

International Search Report issued Dec. 28, 2020 in PCT/JP2020/040216 filed on Oct. 27, 2020, 3 pages.
(Continued)

Primary Examiner — Jaehwan Oh
(74) Attorney, Agent, or Firm — Oblon, McClelland, Maier & Neustadt, L.L.P.

(57) ABSTRACT

The present invention provides: a multilayer film structure which has high crystallinity and planarity; and a method for producing this multilayer film structure. This multilayer film structure is provided with: an Si (111) substrate; a first thin film that is arranged on the Si (111) substrate, while being
(Continued)

formed of a nitride material and/or aluminum; and a second thin film that is arranged on the first thin film, while being formed of a nitride material. An amorphous layer having a thickness of 0 nm or more but less than 1.0 nm are present on the Si (111) substrate; and the full width at half maximum (FWHM) of a rocking curve of the (0002) plane at the surface of this multilayer film structure is 1.50° or less.

14 Claims, 1 Drawing Sheet

(51) Int. Cl.
| | |
|---|---|
| C23C 14/02 | (2006.01) |
| C23C 14/06 | (2006.01) |
| C23C 14/34 | (2006.01) |
| C23C 14/35 | (2006.01) |
| C23C 28/04 | (2006.01) |
| C30B 23/02 | (2006.01) |
| C30B 25/06 | (2006.01) |
| C30B 25/18 | (2006.01) |
| C30B 29/40 | (2006.01) |
| C30B 29/68 | (2006.01) |
| H01L 29/20 | (2006.01) |
| H01L 29/205 | (2006.01) |
| H01L 33/32 | (2010.01) |
| H01S 5/02 | (2006.01) |

(52) U.S. Cl.
CPC ...... *C23C 14/0617* (2013.01); *C23C 14/3407* (2013.01); *C23C 14/35* (2013.01); *C30B 23/025* (2013.01); *C30B 25/06* (2013.01); *C30B 25/186* (2013.01); *C30B 29/403* (2013.01); *C30B 29/406* (2013.01); *C30B 29/68* (2013.01); *H01L 21/02381* (2013.01); *H01L 21/0243* (2013.01); *H01L 21/02433* (2013.01); *H01L 21/02458* (2013.01); *H01L 21/02488* (2013.01); *H01L 21/02502* (2013.01); *H01L 21/02513* (2013.01); *H01L 21/0254* (2013.01); *H01L 21/02587* (2013.01); *H01L 21/02631* (2013.01); *H01L 21/02658* (2013.01); *H01L 21/02661* (2013.01); *H01L 29/2003* (2013.01); *H01L 29/205* (2013.01); *H01L 21/02491* (2013.01); *H01L 21/02505* (2013.01); *H01L 33/32* (2013.01); *H01S 5/021* (2013.01)

(58) Field of Classification Search
CPC .......... H01L 29/2003; H01L 31/03044; H01L 21/02381; H01L 33/0066
See application file for complete search history.

(56) References Cited

U.S. PATENT DOCUMENTS

| | | | |
|---|---|---|---|
| 2009/0289270 A1* | 11/2009 | Hanawa | ............... C30B 25/02 |
| | | | 257/E33.025 |
| 2011/0147763 A1* | 6/2011 | Hanawa | ............. H01L 21/0254 |
| | | | 257/E33.025 |
| 2012/0248457 A1 | 10/2012 | Hanawa et al. | |
| 2012/0292649 A1 | 11/2012 | Sugiyama et al. | |
| 2014/0065360 A1* | 3/2014 | D'Evelyn | ............... C30B 25/18 |
| | | | 428/141 |
| 2014/0342484 A1 | 11/2014 | Hertkorn et al. | |
| 2015/0102371 A1* | 4/2015 | Daigo | ............... H01L 21/02381 |
| | | | 257/94 |
| 2015/0102381 A1 | 4/2015 | Sugiyama et al. | |
| 2022/0149802 A1* | 5/2022 | An | ...................... H10N 30/079 |

FOREIGN PATENT DOCUMENTS

| | | |
|---|---|---|
| JP | 2004-111883 A | 4/2004 |
| JP | 2006-344982 A | 12/2006 |
| JP | 2013-227198 A | 11/2013 |
| JP | 2014-159368 A | 9/2014 |
| WO | WO 2010/016532 A1 | 2/2010 |
| WO | WO 2014/002465 A1 | 1/2014 |

OTHER PUBLICATIONS

Tatejima, Kodai et al., "Examination of fabrication conditions of AlN buffer layer using a reactive sputtering process for GaN template substrates", Lecture summaries of Autumn Lecture Meeting of Japan, Electronic Materials Society, vol. 54, Nov. 2, 2017 (6 total Pages, with English translation).

Tatejima, Kodai et al., "Examination of fabrication conditions of AlN buffer layer using a reactive sputtering process for GaN growth on Si substrate", Lecture preprints of JSAP Autumn Meeting, vol. 78, Sep. 5, 2017 (5 total Pages, with English translation).

* cited by examiner

MULTILAYER FILM STRUCTURE AND METHOD FOR PRODUCING SAME

CROSS-REFERENCE TO RELATED APPLICATIONS

The present application is a 35 U.S.C. § 371 national stage patent application of International patent application PCT/JP2020/040216, filed on Oct. 27, 2020, which is based on and claims the benefits of priority to Japanese Application No. 2019-198886, filed on Oct. 31, 2019, and Japanese Application No. 2020-140980, filed on Aug. 24, 2020. The entire contents of these applications are incorporated herein by reference.

TECHNICAL FIELD

The present invention relates to a multilayer film structure and a method for producing the same.

BACKGROUND ART

A nitride material has excellent semiconductor characteristics. For example, gallium nitride (GaN) is mounted as a material for a blue light emitting diode (LED) or a blue laser diode (LD). Furthermore, with high voltage resistance performance, gallium nitride is suitable for applications such as power devices. Accordingly, a multilayer film structure including a substrate and a nitride thin film on the substrate is useful in the field of electronic devices. In general, such a nitride thin film is produced by a metal organic chemical vapor deposition (MOCVD) method. In addition to the MOCVD method, production of a nitride thin film by a sputtering method has been proposed. Documents disclosing techniques related to production of a nitride thin film include Patent Documents 1 to 3.

Patent Document 1 discloses a method for making a semiconductor crystal film grown on a heated substrate surface by injecting a reaction gas to the surface of the substrate. The method includes injecting the reaction gas in parallel to or at a tilt onto the surface of the substrate, and injecting a pressing dispersal gas toward the substrate (claim of Patent Document 1). EXAMPLE describes GaN grown on a sapphire substrate with using ammonium, hydrogen gas, and TMG (trimethylgallium) gas (EXAMPLE of Patent Document 1).

Patent Document 2 discloses a metal gallium-impregnated gallium nitride shaped article including a gallium nitride phase and a metal gallium phase being present as separate phases, wherein a molar ratio of Ga/(Ga+N) is 55% to 80% (claim 1 of Patent Document 2). EXAMPLE mentions that a gallium nitride-based sputtering target is produced by bonding the obtained metal gallium-impregnated gallium nitride shaped article, and that when the obtained target is subjected to sputtering, no cracking occurs by both RF sputtering and DC sputtering, and a film can be formed ([0102] of Patent Document 2).

Patent Document 3 discloses a method for forming a gallium nitride film, the method comprising a step of sputtering an aluminum target using plasma produced from a gas mixture of nitrogen-containing gas and noble gas to form an aluminum nitride film on a silicon substrate, and a step of forming a gallium nitride film on the aluminum nitride film, and the method comprising a step of forming an aluminum film on the silicon substrate by sputtering an aluminum target, using plasma generated from a noble gas before forming the aluminum nitride film (claim 1 of Patent Document 3).

Patent Document 1: Japanese Unexamined Patent Application, Publication No. H04-164895
Patent Document 2: Japanese Unexamined Patent Application, Publication No. 2014-159368
Patent Document 3: Japanese Unexamined Patent Application, Publication No. 2013-227198

DISCLOSURE OF THE INVENTION

Problems to be Solved by the Invention

Nitride thin films produced by conventional techniques have problems. In order to improve properties of a device, it is desirable that a nitride thin film constituting the device have high crystallinity. Herein, high crystallinity refers to a state in which crystalline orientation is highly aligned in a thin film. Furthermore, when a nitride thin film is used for applications such as a power device, a low-cost Si substrate that can have a larger aperture is most appropriate.

However, in the MOCVD method, it is difficult to form a nitride thin film (for example, a gallium nitride thin film) having high crystallinity on an Si substrate. More specifically, in order to allow a thin film having high crystallinity to grow by the MOCVD method, it is necessary to raise a substrate temperature to about 1000° C. and to form a film at the temperature. During film formation, a melt-back etching, i.e., a phenomenon in which a metal component (for example, gallium) in the thin film reacts with an Si substrate, occurs. Furthermore, gallium nitride has a thermal expansion rate that differs from that of the Si substrate significantly. Consequently, there is a problem that cracking easily occurs in a gallium nitride thin film in a cooling stage after film formation. Due to such problems, an Si substrate cannot be used in the MOCVD method, and consequently, it is necessary to use expensive substrates such as a sapphire substrate or a gallium nitride single crystal substrate.

On the other hand, when the sputtering method is used, the film can be formed at a low temperature of less than 1000° C. Accordingly, a thin film can be formed on an Si substrate without causing problems such as melt-back etching and cracking. However, there is room for improvement in the crystallinity of a conventional nitride thin film formed by the sputtering method. Therefore, in order to produce a multilayer film structure including a highly crystalline nitride thin film on an Si substrate, it is desired to further study film formation conditions of a thin film and interface structures of a multilayer film structure.

In view of such problems, the present inventors have studied, and found that in a multilayer film structure including an Si substrate and a thin film including a nitride material and/or aluminum on the Si substrate, a state in the vicinity of the Si substrate surface has an important role in the crystallinity of the thin film, and that it is important to control the state for obtaining a highly crystalline nitride thin film.

The present invention has been completed based on such findings, and has an objective to provide a multilayer film structure having high crystallinity and flatness, and a method for producing the multilayer film structure.

Means for Solving the Problems

The present invention includes the following aspects (1) to (15). Note here that in this specification, in the expression "to" between numerical values, numerical values at both ends are included. In other words, "X to Y" has the same meaning as "X or more and Y or less". Furthermore, "X and/or Y" has the same meaning as "at least one of X and Y (one or both of X and Y)".

(1) A multilayer film structure including
an Si (111) substrate;
a first thin film provided on the Si (111) substrate, the first thin film including a nitride material and/or aluminum; and
a second thin film provided on the first thin film, the second thin film including a nitride material,
wherein the Si (111) substrate is provided with an amorphous layer thereon, the amorphous layer having a thickness of 0 nm or more and less than 1.0 nm, and
wherein a full width at half maximum (FWHM) of a rocking curve of (0002) plane at a surface of the multilayer film structure of 1.50° or less.

(2) The multilayer film structure as described in the above (1), wherein the amorphous layer has a thickness of 0 nm, and the first thin film is in direct contact with the Si (111) substrate without interposing any other layer.

(3) The multilayer film structure as described in the above (2), wherein the content of oxygen within 10 nm from a surface of the Si (111) substrate is 5 at % or less.

(4) The multilayer film structure as described in the above (2) or (3), wherein the content of silicon nitride within 10 nm from the surface of the Si (111) substrate is 5 at % or less.

(5) The multilayer film structure as described in the above (1), wherein the amorphous layer has a thickness of more than 0 nm and less than 1.0 nm.

(6) The multilayer film structure as described in the above (5), wherein the content of silicon nitride within 10 nm from a surface of the Si (111) substrate is 5 at % or less.

(7) The multilayer film structure as described in any one of the above (1) to (6), wherein arithmetic average roughness (Ra) of a surface of the multilayer film structure is 10.0 nm or less.

(8) The multilayer film structure as described in any one of the above (1) to (7), wherein the first thin film is an aluminum nitride thin film, and the second thin film is a gallium nitride thin film.

(9) The multilayer film structure as described in any one of the above (1) to (8), wherein the structure has an outermost surface including a hexagonal gallium nitride layer, and the gallium nitride layer has a surface having gallium (Ga) polarity.

(10) A semiconductor element including the multilayer film structure as described in any one of the above (1) to (9).

(11) Electronic equipment including the semiconductor element as described in the above (10).

(12) A method for producing the multilayer film structure as described in any one of the above (1) to (9), the method including:
a step of preparing the Si (111) substrate;
a step of immersing the Si (111) substrate in a cleaning liquid;
a step of forming the first thin film by a sputtering method on the Si (111) substrate after immersion; and
a step of forming the second thin film by a sputtering method on the first thin film,
wherein when the first thin film is formed, sputtering energy (Es) represented by the formula: Es=[Input power (unit: W/cm$^2$)]/[Introduced gas pressure (unit: Pa)]$^2$ is 0.1 W/cm$^2$ Pa$^2$ or more and 150 W/cm$^2$ Pa$^2$ or less, and
when the second thin film is formed, sputtering energy (Es) represented by the formula: Es=[Input power (unit: W/cm$^2$)]/[Introduced gas pressure (unit: Pa)]$^2$ is 0.04 W/cm$^2$ Pa$^2$ or more and 150 W/cm$^2$ Pa$^2$ or less.

(13) The method as described in the above (12), wherein when the first thin film is formed, the degree of vacuum in a deposition apparatus immediately before film formation is $1\times10^{-4}$ Pa or less.

(14) The method as described in the above (12) or (13), wherein when the first thin film is formed, argon gas is solely introduced into a deposition chamber to form a thin film having a film thickness of 1 to 10 nm, and then gas including nitrogen is introduced into the deposition chamber to continue film formation.

(15) The method as described in any one of the above (12) to (14), wherein the first thin film has a film thickness of 20 nm or more.

Effects of the Invention

The present invention can provide a multilayer film structure having high crystallinity and flatness and a method for producing the multilayer film structure.

PREFERRED MODE FOR CARRYING OUT THE INVENTION

Specific embodiment of the present invention (hereinafter, referred to as "this embodiment") will be described. However, the present invention is not limited to the following embodiment, and various modifications are possible in a scope where the gist of the present invention is not changed. Furthermore, in the following embodiments, the interpretation should not be limited to a specific combination of requirements. Any combination is possible.

[Multilayer Film Structure]

A multilayer film structure of this embodiment includes an Si (111) substrate; a first thin film provided on the Si (111) substrate, the first thin film including a nitride material and/or aluminum; and a second thin film provided on the first thin film, the second thin film including a nitride material. Furthermore, the Si (111) substrate is provided with an amorphous layer having a thickness of 0 nm or more and less than 1.0 nm. A full width at half maximum (FWHM) of a rocking curve of a (0002) plane is 1.50° or less at the surface of the multilayer film structure.

The multilayer film structure of this embodiment has a highly flat surface, and the first thin film and the second thin film have high crystallinity. For example, when the crystallinity of the first thin film and the second thin film are evaluated by the X-ray diffraction method, a full width at half maximum (FWHM) of a rocking curve of a (0002) plane is 1.50° or less, preferably 1.00° or less, further preferably 0.95° or less, particularly preferably 0.50° or less, and most preferably 0.10° or less. Therefore, the multilayer film structure can be suitably used for a base layer for producing a light-emitting element such as LED and an element for a power device on the Si substrate. Furthermore, the multilayer film structure can be suitably used as a template substrate for allowing a highly crystalline gallium nitride thin film to grow.

To the best of the knowledge of the present inventors, there have been no reports of a multilayer film structure having such a highly flat and highly crystalline nitride thin film on an Si substrate. For example, Patent Document 1 discloses a gallium nitride (GaN) grown on a sapphire substrate by the MOCVD method, but the substrate used is not an Si substrate. Patent Document 2 proposes a gallium nitride sintered body for sputtering target with a low content of oxygen, but does not include a description related to the crystallinity of gallium nitride on an Si substrate. Patent Document 3 discloses a method for charging gallium nitride as a buffer layer in allowing gallium nitride to grow on the Si substrate, but does not include a detailed description related to a structure between the Si substrate and an aluminum nitride buffer layer.

The Si (111) substrate is an Si substrate in which the crystal plane orientation at the main surface is a (111) plane. The production method of the Si (111) substrate is not limited, and may be produced by the Czochralski (CZ) method or the floating zone (FZ) method. Alternatively, the Si (111) substrate may be an Si epitaxial substrate in which an Si single crystal layer is epitaxially grown on the Si single crystal substrate produced by the above methods. The Si (111) substrate may or may not include a dopant element such as a donor or an acceptor on its surface and/or in its interior.

A first thin film is provided on the Si (111) substrate. The first thin film is made of a nitride material and/or aluminum. The nitride material is not particularly limited as long as it is a nitride compound. The nitride material and/or aluminum may or may not include a dopant element. Examples of the first thin film include a gallium nitride thin film, an aluminum nitride thin film, a titanium nitride thin film, an indium nitride thin film, an aluminum gallium nitride thin film, and an indium gallium nitride thin film. A nitride compound is not limited to a stoichiometric composition. For example, gallium nitride (GaN) has a stoichiometric composition having a ratio of gallium (Ga) to nitrogen (N) of 1:1, but deviation from the stoichiometric composition is permitted as long as the crystal structure of gallium nitride is maintained. Furthermore, the embodiment of the first thin film is not particularly limited as long as the first thin film includes a nitride material and/or aluminum. The first thin film may consist of a nitride material alone, or aluminum alone. Alternatively, the first thin film may include a mixed phase of a nitride material and aluminum, or may be a multilayer film including a nitride material layer and an aluminum layer.

The thickness of the first thin film is not particularly limited as long as the first thin film can be regarded to be a thin film. However, if the film thickness is excessively thin, the crystallinity of the first thin film and the second thin film and the surface flatness of the multilayer film structure may become deteriorated. Therefore, the film thickness is preferably 20 nm or more, more preferably 30 nm or more, and further preferably 40 nm or more. The upper limit of the film thickness is not limited. The film thickness may be 1000 nm or less, 500 nm or less, and 250 nm or less. The film thickness may be any of 20 to 1000 nm, 20 to 500 nm, 20 nm to 250 nm, 30 to 1000 nm, 30 to 500 nm, 30 to 250 nm, 40 to 1000 nm, 40 to 500 nm, and 40 to 250 nm. The film thickness may be calculated by preparing a plurality of films sputtered under the same conditions, obtaining the film thickness by a contact type film thickness measuring apparatus or an optical film thickness measuring apparatus, and using the film formation rate obtained from them.

A second thin film including a nitride material is provided on the first thin film. Materials constituting the second thin film are not limited as long as they are nitride compounds. The nitride compound may or may not include a dopant element. Examples of the second thin film include a gallium nitride thin film, an aluminum nitride thin film, a titanium nitride thin film, an indium nitride thin film, an aluminum gallium nitride thin film, and an indium gallium nitride thin film. The thickness of the second thin film is not particularly limited as long as the second thin film is regarded to be a thin film. However, the film thickness is preferably 10 nm or more, further preferably 20 nm or more, and more preferably 30 nm or more. The upper limit of the film thickness is not limited. The film thickness may be 1000 nm or less, 500 nm or less, and 300 nm or less. The film thickness may be any of 10 to 1000 nm, 10 to 500 nm, 10 to 300 nm, 20 to 1000 nm, 20 to 500 nm, 20 to 300 nm, 30 to 1000 nm, 30 to 500 nm, and 30 to 300 nm. The film thickness may be calculated by preparing a plurality of films sputtered under the same conditions, obtaining the film thickness by a contact type film thickness measuring apparatus or an optical film thickness measuring apparatus, and using the film formation rate obtained from them.

In the multilayer film structure of this embodiment, it is preferable that the arithmetic average roughness (Ra) of its surface, for example, the surface of the second thin film be 10.0 nm or less. By reducing the surface roughness in this way, the crystallinity and flatness of the first thin film and the second thin film can be increased. Furthermore, by reducing the surface roughness of the second thin film, a thin film can be allowed to epitaxially grow on the second thin film, and a device such as a semiconductor element having good characteristics can be produced. The arithmetic average roughness (Ra) is preferably 8.0 nm or less, more preferably 5.0 nm or less, and further preferably 1.0 nm or less. The lower limit of the arithmetic average roughness (Ra) is not limited. The arithmetic average roughness (Ra) may be 0.1 nm or more, 0.3 nm or more, or 0.5 nm or more. The arithmetic average roughness (Ra) may be any one of 0.1 to 8.0 nm, 0.1 to 5.0 nm, 0.1 to 1.0 nm, 0.3 to 8.0 nm, 0.3 to 5.0 nm, 0.3 to 1.0 nm, 0.5 to 8.0 nm, 0.5 to 5.0 nm, and 0.5 to 1.0 nm.

The multilayer film structure of this embodiment includes an amorphous layer having a thickness of 0 nm or more and less than 1.0 nm on the Si (111) substrate. In other words, an amorphous layer may or may not be provided on the Si (111) substrate. However, when the amorphous layer is provided, the thickness thereof is less than 1.0 nm. A case where the amorphous layer is not provided (the first aspect) and a case where the amorphous layer is provided (the second aspect) are respectively described hereinafter.

Figure 1:
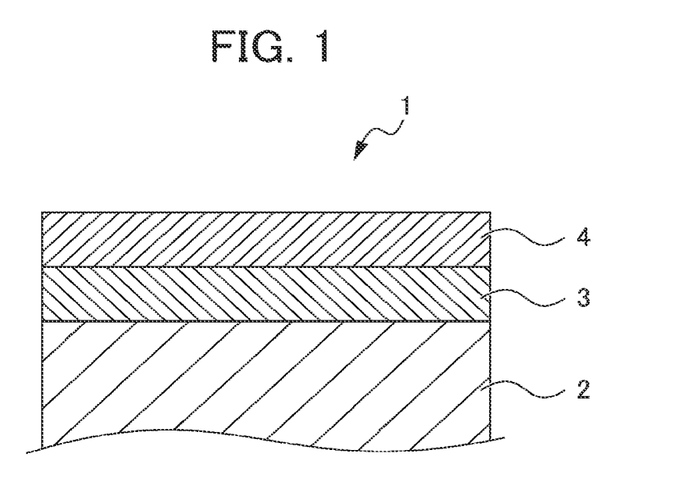
FIG. 1 is an example of a sectional schematic view of a multilayer film structure.

Firstly, the first aspect will be described with reference to FIG. 1. FIG. 1 is a sectional schematic view of a multilayer film structure in the first aspect. A multilayer film structure (1) includes an Si (111) substrate (2), a first thin film (3) provided on the Si (111) substrate (2), and a second thin film (4) provided on the first thin film (3). In the first aspect, an amorphous layer is not provided. In other words, the amorphous layer has a thickness of 0 nm, and the first thin film (3) is in direct contact with the Si (111) substrate (2) without interposing any other layer.

When the first thin film (3) is in direct contact with the Si (111) substrate (2), the crystallinity of the first thin film (3) and the second thin film (4) can be increased. That is, the crystallinity of the Si (111) substrate (2) is high. When the first thin film (3) is in direct contact with the Si (111) substrate (2) having high crystallinity, the crystallinity is succeeded to the first thin film (3). Then, the crystallinity of the first thin film (3) is succeeded to the second thin film (4). Expressed from the production method, the first thin film (3) and the second thin film (4) epitaxially grow satisfactorily. On the contrary, if an excessively thick amorphous layer is provided on the Si (111) substrate (2), epitaxial growing of the first thin film (3) is inhibited, and the crystallinity of the first thin film (3) and the second thin film (4) is reduced.

In the first aspect, as long as high crystallinity of the second thin film (4) is maintained, another layer may be provided between the first thin film (3) and the second thin film. However, from the viewpoint of the crystallinity, it is preferable that another layer be not provided, and the second thin film (4) and the first thin film (3) be in direct contact with each other.

In the first aspect, the content of oxygen within 10 nm from the surface of the Si (111) substrate is preferably 5 at % (atomic %) or less. Herein, the content of oxygen is an amount of oxygen with respect to the total amount of silicon, oxygen, and nitrogen. The content of oxygen within 10 nm from the surface of the substrate is the content of oxygen in a region within 10 nm from the surface of the substrate in the height direction. The height direction refers to a direction perpendicular to the surface of the substrate and the direction apart from the substrate. The measurement is carried out at an arbitrary position in a part within 10% of a radius of the substrate from the center of the substrate. The contained oxygen is derived from a natural oxide film on the surface of the Si (111) substrate used for producing the multilayer film structure. The Si substrate has a surface covered with a natural oxide film immediately after it is obtained. This natural oxide film is amorphous, and the thickness thereof is about 1 to 3 nm. When the Si substrate on which the natural oxide film remains is used as is, the amount of oxygen within 10 nm from the surface of the substrate is excessively increased, and the crystallinity of the first thin film and the second thin film may be deteriorated. On the contrary, when the natural oxide film is almost completely removed in the Si substrate used, the amount of oxygen within 10 nm from the surface of the substrate is suppressed, and the crystallinity of the first thin film and the second thin film can be further increased. From the viewpoint of the crystallinity, the amount of oxygen is preferably small. Therefore, the content of oxygen amount is preferably 4 at % or less, and further preferably 3 at % or less. The lower limit of the oxygen content may be 0 at %, but it is typically 1 at % or more. The oxygen content may be any one of 0 to 4 at %, 0 to 3 at %, 1 to 4 at %, and 1 to 3 at %.

In the first aspect, the content of silicon nitride within 10 nm from the surface of the Si (111) substrate is preferably 5 at % (atomic %) or less. The content of silicon nitride herein denotes the amount of silicon nitride with respect to the total amount of silicon, oxygen, and nitrogen. The silicon nitride is derived from atmospheric gas (introduced gas) which has been used in a first thin film formation step during production of a multilayer film structure. During the formation of the first thin film on the Si (111) substrate, when nitrogen is included in the atmospheric gas at the initial stage of the film formation, the nitridation reaction occurs on the Si substrate surface, and amorphous silicon nitride may be formed. If such silicon nitride is included in the surface of the Si substrate surface with a large amount, the crystallinity of the first thin film and the second thin film may be deteriorated. On the contrary, controlling the atmospheric gas during the formation of the first thin film makes it possible to suppress the amount of silicon nitride formed on the Si substrate surface. From the viewpoint of crystallinity, the amount of silicon nitride within 10 nm from the surface of the substrate is preferably smaller. Accordingly, the content of silicon nitride is preferably 4 at % or less, more preferably 3 at % or less, and particularly preferably 2 at % or less. The lower limit of the content of silicon nitride may be 0 at %, but typically 1 at % or more. The content of silicon nitride may be any one of 0 to 4 at %, 0 to 3 at %, 0 to 2 at %, 1 to 4 at %, 1 to 3 at %, and 1 to 2 at %.

Figure 2:
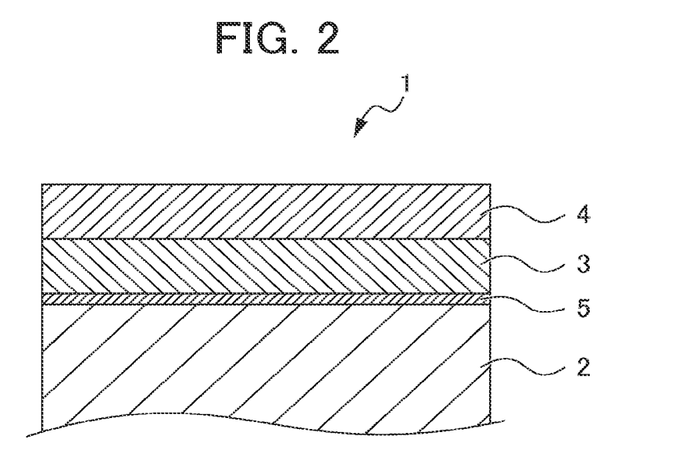
FIG. 2 is another example of a sectional schematic view of a multilayer film structure.

Next, a second aspect will be described with reference to FIG. 2. FIG. 2 is a sectional schematic view of a multilayer film structure in the second aspect. The multilayer film structure (1) includes an Si (111) substrate (2), a first thin film (3) provided on the Si (111) substrate (2), and a second thin film (4) provided on the first thin film (3). In the second aspect, an amorphous layer (5) is present between the Si (111) substrate (2) and the first thin film (3). However, the thickness thereof is less than 1.0 nm. In other words, the thickness of the amorphous layer (5) is more than 0 nm and less than 1.0 nm.

By limiting the thickness of the amorphous layer (5) in this way, even when the amorphous layer (5) is present, the crystallinity of the first thin film (3) and the second thin film (4) can be increased. On the contrary, when the amorphous layer (5) is excessively thick, the first thin film (3) has crystalline orientation that does not aligned and may become polycrystalline thin film. Material of the amorphous layer is not particularly limited. However, the material typically includes silicon dioxide, silicon nitride and/or magnesium oxide, and more typically includes silicon dioxide. The thickness of the amorphous layer (5) may be 0.5 nm or more and less than 1.0 nm.

In the second aspect, as long as high crystallinity of the first thin film (3) is maintained, a layer other than the amorphous layer (5) may be present between the Si (111) substrate (2) and the first thin film (3). However, it is preferable that a layer other than the amorphous layer (5) be not provided. As long as high crystallinity of the second thin film (4) is maintained, another layer may be provided between the first thin film (3) and the second thin film. However, it is preferable that another layer be not provided, and the second thin film (4) and the first thin film (3) be in direct contact with each other.

In the second aspect, the content of oxygen within 10 nm from the surface of the substrate is preferably 5 at % (atomic %) or less. Herein, the content of oxygen is the amount of oxygen with respect to the total amount of silicon, oxygen, and nitrogen. The content of oxygen within 10 nm from the surface of the substrate is the content of oxygen in a region, including an amorphous layer, within 10 nm from the surface of the substrate. The contained oxygen is derived from a natural oxide film on the surface of the Si (111) substrate similar to the first aspect. Using the Si (111) substrate from which the natural oxide film is almost completely removed makes it possible to suppress the amount of oxygen within 10 nm from the surface of the substrate, which enables an increased crystallinity of the first thin film and the second thin film. The content of oxygen amount is preferably 4 at % or less, and further preferably 3 at % or less. The lower limit of the oxygen content may be 0 at %, but it is typically 1 at % or more. The oxygen content may be any one of 0 to 4 at %, 0 to 3 at %, 1 to 4 at %, and 1 to 3 at %.

In the second aspect, the content of silicon nitride within 10 nm from the surface of the substrate is preferably 5 at %

(atomic %) or less. The silicon nitride is derived from an atmospheric gas which has been used in the first thin film formation step similar to the first aspect. By suppressing the amount of silicon nitride within 10 nm from the surface of the substrate, the crystallinity of the first thin film and the second thin film can be further increased. From the viewpoint of the crystallinity, the amount of silicon nitride is preferably small. The content of silicon nitride is preferably 4 at % or less, more preferably 3 at % or less, and particularly preferably 2 at % or less. The lower limit of the content of silicon nitride may be 0 at %, but it is typically 1 at % or more. The content of silicon nitride may be any one of 0 to 4 at %, 0 to 3 at %, 0 to 2 at %, 1 to 4 at %, 1 to 3 at %, and 1 to 2 at %.

Both in the first aspect and the second aspect, a combination of materials constituting the first thin film and the second thin film is not limited. The material constituting the first thin film and material constituting the second thin film may be the same as or different from each other. Furthermore, the first thin film and/or second thin film may be a single layer, or may include a plurality of layers. Examples of the combination of first thin film/second thin film include an aluminum nitride thin film/a gallium nitride thin film, a titanium nitride thin film/a gallium nitride thin film, an aluminum nitride thin film/an indium gallium nitride thin film, an aluminum gallium nitride thin film/an aluminum nitride thin film, an aluminum gallium nitride thin film/a gallium nitride thin film, an aluminum thin film/a gallium nitride thin film, an aluminum thin film/an indium gallium nitride thin film, an aluminum thin film/an aluminum nitride thin film, an aluminum thin film/aluminum nitride thin film/a gallium nitride thin film, an aluminum thin film/a titanium nitride thin film/a gallium nitride thin film, an aluminum thin film/an aluminum nitride thin film/an indium gallium nitride thin film, an aluminum thin film/an aluminum gallium nitride thin film/an aluminum nitride thin film, and an aluminum thin film/an aluminum gallium nitride thin film/a gallium nitride thin film. Among them, the combination of an aluminum nitride thin film/a gallium nitride thin film, an aluminum thin film/a gallium nitride thin film, and an aluminum thin film/an aluminum nitride thin film/a gallium nitride thin film are preferable, and the combination of an aluminum nitride thin film/a gallium nitride thin film is particularly preferable.

In particular, it is preferable that the first thin film be an aluminum nitride (AlN) thin film, and the second thin film be a gallium nitride (GaN) thin film. Gallium nitride (GaN) is useful as a material for light-emitting elements such as a blue light emitting diode (LED) and a blue laser diode (LD), as well as semiconductor elements such as a power device. When the second thin film includes gallium nitride (GaN), the multilayer film structure itself can be applied in electronic devices such as a light-emitting element and a semiconductor element. Furthermore, the multilayer film structure can be used as a base substrate, and gallium nitride (GaN) can be formed thereon. Since gallium nitride (GaN) formed on the multilayer film structure epitaxially grows, it can be made into a device having excellent characteristics.

When the first thin film includes aluminum nitride (AlN), the crystallinity of gallium nitride (GaN) constituting the second thin film can be further increased. More specifically, when gallium nitride (GaN) is directly formed on the Si (111) substrate, melt-back etching, i.e., a phenomenon in which silicon (Si) and gallium (Ga) react with each other, may occur under some film formation conditions. Providing aluminum nitride (AlN) on the Si (111) substrate can suppress melt-back etching more remarkably.

In the multilayer film structure, it is preferable that the structure have an outermost surface, for example, the surface of the second thin film, including a hexagonal gallium nitride layer, and the gallium nitride layer have a surface having gallium (Ga) polarity. When gallium nitride (GaN) is further formed on the multilayer film structure, gallium (Ga) polarity at the outermost surface makes it possible to suppress the formation of hexagonal facets that make device production difficult.

[Semiconductor Element and Electronic Equipment]

A semiconductor element of this embodiment has the above-mentioned multilayer film structure. Furthermore, the electronic equipment of this embodiment includes the above-mentioned semiconductor element. Examples of the semiconductor element include light-emitting elements such as a blue light emitting diode (LED) and a blue laser diode (LD), and power devices such as a diode, a transistor, and the like. The semiconductor element includes the multilayer film structure of this embodiment as a base layer, and may include a thin film and/or a thick film including a nitride material such as gallium nitride (GaN) thereon. The semiconductor element and the electronic equipment may include other functional parts other than the multilayer film structure. The semiconductor element and the electronic equipment have excellent characteristics due to high crystallinity of nitride thin film constituting the multilayer film structure.

[Method for Producing Multilayer Film Structure]

The method for producing the multilayer film structure of this embodiment is not limited. However, the multilayer film structure can be produced suitably by the following method.

The method for producing a multilayer film structure of this embodiment includes the following steps: a step of preparing an Si (111) substrate (substrate preparing step), a step of immersing the Si (111) substrate in a cleaning liquid (wet etching step), a step of forming a first thin film by a sputtering method on the Si (111) substrate after immersion (first thin film formation step), and a step of forming a second thin film by a sputtering method on the first thin film (second thin film formation step). In forming the first thin film, sputtering energy (Es) represented by the formula: Es=[Input power density (unit: W/cm$^2$)]/[Introduced gas pressure (unit: Pa)]$^2$ is 0.1 W/cm$^2$ Pa$^2$ or more and 150 W/cm$^2$ Pa$^2$ or less. In forming the second thin film, sputtering energy (Es) represented by the formula: Es=[Input power density (unit: W/cm$^2$)]/[Introduced gas pressure (unit: Pa)]$^2$ is 0.04 W/cm$^2$ Pa$^2$ or more and 150 W/cm$^2$ Pa$^2$ or less. Detail of each step will be described hereinafter.

<Substrate Preparing Step>

In the substrate preparing step, an Si (111) substrate is prepared. The production method of the Si (111) substrate is not limited, and may be produced by the Czochralski (CZ) method or the floating zone (FZ) method. Alternatively, the Si (111) substrate may be an Si epitaxial substrate in which an Si single crystal layer is epitaxially grown on the Si single crystal substrate which has been produced by the above methods. The Si (111) substrate may or may not include a dopant element such as a donor or an acceptor on its surface and/or in its interior.

<Wet Etching Step>

In the wet etching step, the prepared Si (111) substrate is immersed in a cleaning liquid. Examples of the cleaning liquid used for immersion include a hydrofluoric acid aqueous solution, sulfuric acid, hydrochloric acid, hydrogen peroxide, ammonium hydroxide, trichloroethylene, acetone, methanol, isopropanol and the like. Among them, a hydrofluoric acid aqueous solution is preferable. An ultrasonic cleaning machine may be used in immersing the Si (111) substrate in the cleaning liquid. An Si (111) substrate is generally covered with contaminants or natural oxide film when it is newly obtained. The natural oxide film is amorphous and has a thickness of about 1 to 3 nm. An Si (111) substrate having contaminants or a natural oxide film remaining may excessively increase the oxygen content within 10 nm from the surface of the substrate and deteriorate the crystallinity of the first thin film and the second thin film. Therefore, a wet etching step is provided as removing treatment (cleaning treatment) with respect to the oxide film on the surface of the Si (111) substrate. In a case where a hydrofluoric acid aqueous solution is used as the cleaning liquid, the concentration of hydrofluoric acid is preferably 5 to 10 mass %. The concentration of hydrofluoric acid of 5 mass % or more allows the surface to be modified with hydrogen. The concentration exceeding 10 mass % may increase the surface roughness.

The immersion time of the Si (111) substrate is preferably 5 to 100 seconds. The immersion time of 5 seconds or more allows oxide films to be removed sufficiently. Accordingly, the thickness of the amorphous layer in the produced multilayer film structure can be reduced. The immersion time of 100 seconds or less can suppress the decrease of the surface roughness during etching. The immersion time may be 20 seconds or more and 100 seconds or less. Thus, it is possible to produce a multilayer film structure of the first aspect including an amorphous layer having a thickness of 0 nm (no amorphous present). The immersion time may be 5 seconds or more and less than 20 seconds. Thus, it is possible to produce a multilayer film structure of the second aspect including an amorphous layer having a thickness of more than 0 nm and less than 1.0 nm.

After immersion in the cleaning liquid, remaining droplets on the surface of the substrate are removed. The remaining droplets can be removed by techniques such as surface blowing using nitrogen gas. In the Si (111) substrate after wet etching treatment, oxide films are removed to a considerable degree and its surface thereof is flat. The Si (111) after treatment has the arithmetic average roughness (Ra) of 0.5 nm or less, and preferably 0.3 nm or less. Since the surface of the substrate is easily contaminated with impurities in the atmosphere after remaining droplets are removed, it is preferable that the procedure proceed to the first thin film formation step without leaving a time interval of 24 hours or more. After the wet etching step is completed, the procedures may proceed to the first thin film formation step within five hours, or may proceed within one hour.

<First Thin Film Formation Step>

In a first thin film formation step, the first thin film is formed by a sputtering method on the Si (111) substrate after immersion. Well-known techniques may be employed as the sputtering method. Examples of such well-known techniques include a DC sputtering method, an RF sputtering method, an AC sputtering method, a DC magnetron sputtering method, an RF magnetron sputtering method, a pulse sputtering method, and an ion beam sputtering method. However, a DC magnetron sputtering method or an RF magnetron sputtering method, which enables uniform and rapid film formation in a large area, is preferable.

As a sputtering target, well-known targets used for film formation of a nitride thin film or an aluminum thin film can be used. Examples of such targets include a metal target or a nitride target. From the viewpoint of enhancing the crystallinity of entire film, it is preferable that an amount of oxygen in the sputtering target be as small as possible. The content of oxygen is preferably 3 at % (atomic %) or less, and further preferably 1 at % or less. As an area of the target is larger, a larger area of the substrate can be subjected to the film formation, which improves uniformity of the film thickness and film quality. The area of the target is preferably 18 cm$^2$ or more, and more preferably 100 cm$^2$ or more. Note here that the area of the target is an area of one of the main surfaces of the target.

During the formation of the first thin film, the ultimate vacuum inside a deposition apparatus immediately before film formation is preferably $1\times10^{-4}$ or less, more preferably $7\times10^{-6}$ Pa or less, still more preferably $2\times10^{-6}$ Pa or less, further preferably $9\times10^{-6}$ Pa or less, and particularly preferably $5\times10^{-6}$ Pa or less. Increase in the degree of vacuum inside a device before film formation suppresses contamination of residual gas as impurities into a deposited film (nitride thin film) during film formation. As a result, the crystallinity of the deposited film can be further improved. For the purpose of removing residual gas, the apparatus may be subjected to baking treatment prior to film formation. Furthermore, sputtering film formation is preferably carried out in a state in which the substrate is heated. This promotes the migration of particles deposited on the substrate, so that a deposited film having a stable crystal state can be formed. The substrate heating temperature (film formation temperature) is preferably 100 to 800° C., and more preferably 200 to 600° C. The film formation temperature is preferably applied in a stepwise manner from a low temperature. The film formation temperature at the initial stage of the film formation is preferably 200 to 500° C. This can suppress excessive migration, which enables a flat film. In addition, film formation at 300 to 600° C. and at 500 to 800° C. in a stepwise manner makes it possible to achieve both flatness and crystallinity.

As the introduced gas at the time of sputtering, well-known gas used for the film formation of the nitride thin film can be used. Examples of such gas include a gas mixture of argon (Ar) and nitrogen ($N_2$). Other gases such as ammonium may be introduced as necessary. However, in the film formation of the first thin film, it is preferable that argon (Ar) gas be solely introduced into the deposition chamber to form a thin film having a film thickness of 3 to 10 nm, and then film formation is continued by introducing gas including nitrogen ($N_2$) into the deposition chamber. For example, in a case where a metal target (metal aluminum target and the like) is used for the film formation, at the initial stage of the film formation, argon (Ar) gas is solely introduced to form a metal film (aluminum film and the like) having a thickness of 1 to 10 nm. Thereafter, nitrogen ($N_2$)-containing gas (for example, gas mixture of nitrogen and argon) is introduced during the successive film formation. At this stage, a metal film is nitrided to a nitride film (aluminum nitride film and the like), and further nitride is deposited thereon. Thus, a nitride thin film (aluminum nitride thin film and the like) having high crystallinity and less nitrogen defects can be obtained. On the contrary, an introduction of nitrogen ($N_2$)-containing gas at the initial stage of film formation may result in the Si substrate surface to be nitrided and the formation of an amorphous silicon nitride. Furthermore, even in a case where (Ar) gas is introduced solely, if the film thickness of the metal film at the initial stage of film formation is less than 1 nm, then silicon nitride may be formed on the Si substrate surface due to the nitrogen ($N_2$) introduced during the successive film formation. The formation of silicon nitride on the surface of the substrate may inhibit heteroepitaxial growth of the first thin film. If the film thickness of the metal film at the initial stage of film formation is more than 10 nm, it may be difficult to sufficiently nitride the metal film during the successive film formation. Therefore, the film thickness at the initial stage of film formation before introduction of the nitrogen-containing gas is preferably 1 to 10 nm. The film thickness at the initial stage of film formation may be 1 to 5 nm.

The sputtering energy (Es) in the film formation of the first thin film is 0.1 W/cm² Pa² or more and 150 W/cm² Pa² or less. Herein, the sputtering energy (Es) is energy of sputtered particles in sputtering film formation, and defined as the formula: Es=[Input power density (unit: W/cm²)]/[Introduced gas pressure (unit: Pa)]². The input power density is input energy per unit area obtained by dividing the actual input power by the area of the sputtering target. Thus, the first thin film having high crystallinity can be formed. The detailed reason is not clear. However, it is assumed that the magnitude of the sputtering energy (Es) changes the characteristics of the sputtered particles, such as the adhesion of the sputtered particles reaching the substrate, the diffusion length of the sputtered particles migrating on the substrate, and/or the penetration depth into the film already deposited, thereby affecting the crystallinity of the nitride-based thin film. Es may be 0.5 W/cm² Pa² or more, 1 W/cm² Pa² or more, 2 W/cm² Pa² or more, 5 W/cm² Pa² or more, 10 W/cm² Pa² or more, 15 W/cm² Pa² or more, 20 W/cm² Pa² or more, or 25 W/cm² Pa² or more. Es may be 100 W/cm² Pa² or less, 60 W/cm² Pa² or less, 30 W/cm² Pa² or less, 25 W/cm² Pa² or less, 20 W/cm² Pa² or less, 15 W/cm² Pa² or less, or 10 W/cm² Pa² or less. Es may be any one of 0.5 to 100 W/cm² Pa², 0.5 to 60 W/cm² Pa², 0.5 to 30 W/cm² Pa², 0.5 to 25 W/cm² Pa², 0.5 to 20 W/cm² Pa², 0.5 to 15 W/cm² Pa², 0.5 to 10 W/cm² Pa², 1 to 100 W/cm² Pa², 1 to 60 W/cm² Pa², 1 to 30 W/cm² Pa², 1 to 25 W/cm² Pa², 1 to 20 W/cm² Pa², 1 to 15 W/cm² Pa², 1 to 10 W/cm² Pa², 2 to 100 W/cm² Pa², 2 to 60 W/cm² Pa², 2 to 30 W/cm² Pa², 2 to 25 W/cm² Pa², 2 to 20 W/cm² Pa², 2 to 15 W/cm² Pa², 2 to 10 W/cm² Pa², 5 to 100 W/cm² Pa², 5 to 60 W/cm² Pa², 5 to 30 W/cm² Pa², 5 to 25 W/cm² Pa², 5 to 20 W/cm² Pa², 5 to 15 W/cm² Pa², 5 to 10 W/cm² Pa², 10 to 100 W/cm² Pa², 10 to 60 W/cm² Pa², 10 to 30 W/cm² Pa², 10 to 25 W/cm² Pa², 10 to 20 W/cm² Pa², 10 to 15 W/cm² Pa², 15 to 100 W/cm² Pa², 15 to 60 W/cm² Pa², 15 to 30 W/cm² Pa², 15 to 25 W/cm² Pa², 15 to 20 W/cm² Pa², 20 to 100 W/cm² Pa², 20 to 60 W/cm² Pa², 20 to 30 W/cm² Pa², 20 to 25 W/cm² Pa², 25 to 100 W/cm² Pa², 25 to 60 W/cm² Pa², and 25 to 30 W/cm² Pa².

In a case where film formation is carried out by introducing argon (Ar) gas solely at the initial stage of film formation, and introducing nitrogen (N₂)-containing gas in the successive film formation, the sputtering energy (Es) in the initial stage of the film formation and the sputtering energy (Es) in the successive film formation may be the same as or may be different from each other.

A film thickness of the first thin film is preferably 20 nm or more. An excessively small film thickness of the first thin film may deteriorate the crystallinity of the first thin film and the second thin film and surface flatness of the multilayer film structure. Accordingly, it is desirable that the film thickness of the first thin film be thick to some extent. The film thickness of the first thin film may be 30 nm or more, 40 nm or more, 50 nm or more, 60 nm or more, 70 nm or more, or 80 nm or more. The film thickness may be 90 nm or less, 80 nm or less, 70 nm or less, 60 nm or less, or 50 nm or less. The film thickness may be any one of 30 to 90 nm, 30 to 80 nm, 30 to 70 nm, 30 to 60 nm, 30 to 50 nm, 40 to 90 nm, 40 to 80 nm, 40 to 70 nm, 40 to 60 nm, 40 to 50 nm, 50 to 90 nm, 50 to 80 nm, 50 to 70 nm, 50 to 60 nm, 60 to 90 nm, 60 to 80 nm, 60 to 70 nm, 70 to 90 nm, 70 to 80 nm, and 80 to 90 nm.

<Second Thin Film Formation Step>

In a second thin film formation step, a second thin film is formed on the first thin film by a sputtering method. Preferable sputtering methods includes a DC magnetron sputtering method, a pulse sputtering method, or an RF magnetron sputtering method, which enables uniform and rapid film formation on a large area. As a sputtering target, well-known targets used for film formation of a nitride thin film can be employed. However, a nitride target (for example, a gallium nitride target) is preferably used. The content of oxygen in the sputtering target is preferably 3 at % (atomic %) or less, and further preferably 1 at % or less. The target area is preferably 18 cm² or more, and further preferably, 100 cm² or more.

The sputtering film formation is preferably carried out in a state in which the substrate is heated, similar to the film formation of the first thin film. The substrate heating temperature (film formation temperature) is preferably 100 to 800° C., and more preferably 300 to 800° C. As the introduced gas in sputtering, well-known gas used for film formation of a nitride thin film can be used. Examples of such gas include a gas mixture of argon (Ar) and nitrogen (N₂). Other gases such as ammonium may be introduced as necessary.

During the formation of the second thin film, the sputtering energy (Es) is 0.04 W/cm² Pa² or more and 150 W/cm² Pa² or less. Thus, a second thin film having high crystallinity can be formed. Es may be 0.1 W/cm² Pa² or more, 0.5 W/cm² Pa² or more, 1 W/cm² Pa² or more, 5 W/cm² Pa² or more, 10 W/cm² Pa² or more, 20 W/cm² Pa² or more, 25 W/cm² Pa² or more, or 30 W/cm² Pa² or more. Es may be 100 W/cm² Pa² or less, 70 W/cm² Pa² or less, 35 W/cm² Pa² or less, 30 W/cm² Pa² or less, or 25 W/cm² Pa² or less. Es may be any one of 0.1 to 100 W/cm² Pa², 0.1 to 70 W/cm² Pa², 0.1 to 35 W/cm² Pa², 0.1 to 30 W/cm² Pa², 0.1 to 25 W/cm² Pa², 0.5 to 100 W/cm² Pa², 0.5 to 70 W/cm² Pa², 0.5 to 35 W/cm² Pa², 0.5 to 30 W/cm² Pa², 0.5 to 25 W/cm² Pa², 1 to 100 W/cm² Pa², 1 to 70 W/cm² Pa², 1 to 35 W/cm² Pa², 1 to 30 W/cm² Pa², 1 to 25 W/cm² Pa², 5 to 100 W/cm² Pa², 5 to 70 W/cm² Pa², 5 to 35 W/cm² Pa², 5 to 30 W/cm² Pa², 5 to 25 W/cm² Pa², 10 to 100 W/cm² Pa², 10 to 70 W/cm² Pa², 10 to 35 W/cm² Pa², 10 to 30 W/cm² Pa², 10 to 25 W/cm² Pa², 20 to 100 W/cm² Pa², 20 to 70 W/cm² Pa², 20 to 35 W/cm² Pa², 20 to 30 W/cm² Pa², 20 to 25 W/cm² Pa², 25 to 100 W/cm² Pa², 25 to 70 W/cm² Pa², 25 to 35 W/cm² Pa², 25 to 30 W/cm² Pa², 30 to 100 W/cm² Pa², 30 to 70 W/cm² Pa², and 30 to 35 W/cm² Pa².

A step of stacking another nitride thin film on the second thin film may be provided as necessary. For example, a gallium nitride thin film is formed as the second thin film by a sputtering method, and then a gallium nitride thin film may be formed thereon by an MOCVD method.

In this way, a multilayer film structure of this embodiment is produced.

EXAMPLES

The present invention will be further described with reference to the following EXAMPLEs and COMPARATIVE EXAMPLEs. However, the present invention is not limited to the following EXAMPLEs.

Example 1

A multilayer film structure of Example 1 is produced and evaluated as follows.

(1) Production of Multilayer Film Structure

<Preparation Step>

An n-type Si (111) substrate (manufactured by MATSU-ZAKI SEISAKUSYO CO., LTD., off-angle: none) was prepared as an Si substrate. This substrate had a diameter of 50±0.5 mmϕ), a thickness of 425±25 μm, and an electrical resistance of 1000 Ω·cm or more.

<Wet Etching Step>

The prepared Si substrate was subjected to wet etching treatment (cleaning treatment). Firstly, hydrofluoric acid (KANTO CHEMICAL CO., INC., Ultrapure grade) was diluted with super pure water (KANTO CHEMICAL CO., INC., Ultrapure grade) to prepare a diluted hydrofluoric acid aqueous solution having a concentration of 5 mass %. Next, the Si substrate was immersed in the prepared diluted hydrofluoric acid aqueous solution for 30 seconds, and the substrate was pulled out of the hydrofluoric acid aqueous solution. Thereafter, droplets remaining on the surface of the substrate were removed by blowing nitrogen gas thereto. Thus, an Si substrate (Ra: 0.15 nm) that had undergone a cleaning step was obtained. Thereafter, the process proceeded to the first thin film deposition step with no time interval.

<Film Formation Step of First Thin Film>

A first thin film was formed on an Si substrate that had been subjected to wet etching treatment, by using a magnetron sputtering apparatus. Firstly, a metal aluminum (Al) target (purity: 99.99 mass %) was prepared as the sputtering target. The Si substrate was arranged in a deposition chamber of a sputtering apparatus together with the target, and the deposition chamber was evacuated. After the degree of vacuum (the ultimate vacuum before film formation) inside the deposition chamber reached $1.9 \times 10^{-6}$ Pa, film formation was initiated.

The film formation of the first thin film was carried out as follows. Firstly, argon (flow rate: 20 sccm) was used solely as the introduced gas into the deposition chamber to form a thin film having a film thickness of 3 nm. At this time, the substrate temperature was 300° C., and the sputtering energy (Es) was 20 W/cm² Pa². Next, the introduced gas was changed to a gas mixture of nitrogen (flow rate: 3 sccm) and argon (flow rate: 17 sccm) to form a thin film having a film thickness of 47 nm. At this time, the substrate temperature was 750° C., and the sputtering energy (Es) was 5 W/cm² Pa². Thus, an aluminum nitride thin film having a film thickness of 50 nm was formed.

<Film Formation Step of Second Thin Film>

A second thin film was formed on the formed first thin film (aluminum nitride thin film) by using a magnetron sputtering apparatus. Firstly, a gallium nitride (GaN) target (purity: 99.99 mass %) was prepared as a sputtering target. The Si substrate on which the first thin film had been formed was arranged in a deposition chamber together with the target. A gas mixture of nitrogen (flow rate: 10 sccm) and argon (flow rate: 10 sccm) was used for the gas introduced into the deposition chamber. The film formation was carried out under the condition of the substrate temperature of 750° C. and the sputtering energy of 20 W/cm² Pa². Thus, a gallium nitride (GaN) thin film having a film thickness of 50 nm was formed.

Thus, a multilayer film structure including an aluminum nitride thin film (first thin film) and a gallium nitride thin film (second thin film) on the Si substrate was produced. The film formation conditions of the first thin film and the second thin film are respectively shown in Tables 1 to 3.

(2) Evaluation

The obtained multilayer film structure was evaluated as follows.

<Analysis of Structure>

An interface between the Si substrate and the first thin film was analyzed to examine the presence or absence of an amorphous layer and thickness thereof. The analysis was carried out as follows. Firstly, as a protective film, a carbon coat was formed on the surface of the multilayer film structure, which was then subjected to focused ion beam (FIB) processing to produce a test sample for observation. Next, cross-sectional observation on the test sample was carried out using a field emission transmission electron microscope (FE-TEM; JEM-2100F manufactured by JEOL Ltd.). At this time, the electron beam acceleration voltage was 200 kV.

<Oxygen Content and Silicon Nitride Content>

The content of oxygen and the content of silicon nitride within 10 nm from the Si substrate including an amorphous layer was measured by X-ray photoelectron spectroscopy (ESCA; Electron Spectroscopy for Chemical Analysis). In the analysis in the depth direction, a film sample was ion milled with argon (Ar) monomer ions for measurement. The content of each element (O, N, Si) was calculated using the peak areas of O1s, N1s, and Si2p in the measurement. The content of oxygen and the content of silicon nitride were determined as the atomic concentration with respect to the total concentration of silicon (Si), oxygen (O) and nitrogen (N). Details of the measurement conditions were as follows.

X-ray source: monochrome Al-Kα line (25 W, 15 kW)

Diameter of X ray irradiation: 100 μmϕ

Pass Energy: 93.9 eV (O1s, N1s), 11.75 eV (Si2p)

Step Size: 0.1 eV

<Crystallinity of Thin Film>

Crystallinity of the first thin film and the second thin film were evaluated using an X-ray diffractometer (D8 DISCOVER manufactured by Bruker AXS). Analysis was carried out under the condition of 40 kV and 40 mA, in HIGH RESOLUTION mode. A monochromator was used to remove CuKα2, and ω scanning was carried out. The rocking curve of a (0002) plane was measured to obtain full width at half maximum (FWHM), which was used as an index of the crystallinity of the thin film. The details of the analysis condition are shown below.

Radiation source: CuKα line (λ=0.15418 nm)

Monochromator: Ge (220)

Pathfinder: Crystal3B

Measurement mode: ω scanning

Measurement interval: 0.01°

(0.0005° when the half-power band width was 0.1° or less)

Measurement time: 0.5 seconds

Measurement range: ω=0° to 35°

<Polarity and Crystallinity of Gallium Nitride Thin Film>

Polarity and crystal phase of gallium nitride thin films were evaluated by using Time of Flight Low Energy Atom Scattering Spectroscopy (TOFLAS-3000 manufactured by Pascal Co., Ltd.). The multilayer film structure was set in the apparatus so that its film forming surface faced upward, and measurement was carried out. Polarity and crystal phase of the gallium nitride thin film were determined by comparing the pole figure obtained by measurement with the pole figure obtained by simulation of each crystal phase and polarity of the uppermost 4 layers. Details of the measurement condition are shown below.

Probe: He (atomic scatter)
Energy: 3 keV
Beam source-target distance: 805 mm
Target-detector distance: 395 mm
Degree of vacuum in the analysis chamber: $2\times10^{-3}$ Pa or less <Surface Roughness of Multilayer Film Structure>

Arithmetic average roughness (Ra) of the multilayer film structure surface was measured. Measurement was carried out using scanning probe microscope (NanoScopeIIIa manufactured by Bruker AXS) in a tapping mode AFM for the view field of 2 μm×2 μm.

Examples 2 and 3

Film formation conditions of the first thin film and the second thin film were set as shown in Tables 1 to 3. The multilayer film structures were produced and evaluated in the same manner as in Example 1 except for the above.

Example 4

The immersion time of the Si substrate was 5 seconds in the wet etching treatment. The film formation conditions of the first thin film and the second thin film were set as shown in Tables 1 to 3. The multilayer film structure was produced and evaluated in the same manner as in Example 1 except for the above.

Example 5

In the film formation of the first nitride thin film, the film formation after the initial time was carried out with 3 nm at 500° C. and 44 nm at 750° C. The film formation condition of the second nitride thin film were set as shown in Table 3. The multilayer film structure was produced and evaluated in the same manner as in Example 1 except for the above.

Examples 6 to 17

The film formation conditions of the first thin film and the second thin film were set as shown in Tables 1 to 3. The multilayer film structures were produced and evaluated in the same manner as in Example 1 except for the above.

Example 18 (Comparative Example)

In the wet etching treatment, the immersion time of the Si substrate was two seconds. The film formation conditions of the first thin film and the second thin film were set as shown in Tables 1 to 3. The multilayer film structure was produced and evaluated in the same manner as in Example 1 except for the above.

Example 19 (Comparative Example)

The film formation conditions of the first thin film and the second thin film were set as shown in Tables 1 to 3. The multilayer film structure was produced and evaluated in the same manner as in Example 1 except for the above.

Example 20 (Comparative Example)

The first thin film and the second thin film were formed after the wet etching treatment and storage under air atmosphere for one day. The film formation conditions of the first thin film and the second thin film were set as shown in Tables 1 to 3. The multilayer film structure was produced and evaluated in the same manner as in Example 1 except for the above.

Examples 21 to 25 (Comparative Examples)

The film formation conditions of the first thin film and the second thin film were set as shown in Tables 1 to 3. The multilayer film structures were produced and evaluated in the same manner as in Example 1 except for the above.

(3) Results

Evaluation results for Examples 1 to 25 are shown in Table 4. Examples 1 to 17 are working EXAMPLEs, and Examples 18 to 25 are COMPARATIVE EXAMPLEs.

As shown in Table 4, in samples of Examples 1 to 17, i.e., working EXAMPLEs, the thickness of an amorphous layer was as small as 0.9 nm or less. The full width at half maximum (FWHM) was as small as 0.98° or less, and the arithmetic average roughness (Ra) was as small as 8.1 nm or less. Thus, in Examples 1 to 17, a Ga-polar gallium nitride thin film (nitride-based thin film) having high flatness and crystallinity as well as having a hexagonal crystal was successfully prepared.

On the contrary, in samples of Examples 18 to 20, i.e., COMPARATIVE EXAMPLEs, the thickness of an amorphous layer was as large as 2.0 nm. Consequently, the full width at half maximum (FWHM) and the arithmetic average roughness (Ra) were large, and the crystallinity and surface flatness were poor. For example, in Example 18 where the immersion time of the Si substrate was two seconds, a 2.0 nm thick amorphous, which was seemingly a natural oxide film remained between the Si substrate and the first thin film. Thus, a film having required characteristics was not obtained. In Example 19 where film formation was carried out with argon and nitrogen for ten seconds, a 2.0 nm thick amorphous film remained, which was attributed to an oxide film caused by impurities in gas, remained between the Si substrate and the first thin film. Thus, a film having required characteristics was not obtained. Also in Example 20, where the sample had been stored for one day before the film formation of the first thin film, a 2.0 nm thick amorphous film, which was attributed to an oxide film caused by impurities in gas, remained between the Si substrate and the first thin film. Thus, a film having a required characteristics was not obtained. In Example 21, where the sputtering energy (Es) in film formation of the first thin film and the second thin film was 200 W/cm$^2$ Pa$^2$, and in Example 22, where the film thickness of the first thin film was 10 nm, a film having required characteristics was not obtained. In Example 23, where the ultimate vacuum before the film formation of the first thin film was $2.3\times10^{-4}$ Pa, the amount of oxygen in a region within 10 nm from the Si surface was large. Thus, a film having required characteristics was not obtained. In Example 24, where the sputtering energy (Es) of the first thin film was 0.05 W/cm$^2$ Pa$^2$, and in Example 25, where the sputtering energy (Es) of the second thin film was 0.03 W/cm$^2$ Pa$^2$, a film having required characteristics was not obtained.

TABLE 1

Film formation conditions of first nitride thin film

| | Growing in initial stage | | | | | | |
|---|---|---|---|---|---|---|---|
| | Ultimate vacuum before film formation (Pa) | Target | Sputtering energy Es (W/cm²Pa²) | Introduced gas Nitrogen (sccm) | Introduced gas Argon (sccm) | Substrate temperature (° C.) | Film thickness (nm) |
| Example1 | 1.9 × 10⁻⁶ | Al | 20 | 0 | 20 | 300 | 3 |
| Example2 | 2.3 × 10⁻⁶ | Al | 20 | 0 | 20 | 300 | 3 |
| Example3 | 1.8 × 10⁻⁶ | Al | 20 | 0 | 20 | 300 | 3 |
| Example4 | 2.4 × 10⁻⁶ | Al | 20 | 0 | 20 | 300 | 3 |
| Example5 | 2.1 × 10⁻⁶ | Al | 20 | 0 | 20 | 300 | 3 |
| Example6 | 5.1 × 10⁻⁶ | Al | 30 | 0 | 20 | 300 | 1.5 |
| Example7 | 2.2 × 10⁻⁶ | Al | 20 | 0 | 20 | 300 | 3 |
| Example8 | 2.1 × 10⁻⁶ | Al | 20 | 0 | 20 | 300 | 3 |
| Example9 | 2.0 × 10⁻⁶ | Al | 20 | 0 | 20 | 300 | 3 |
| Example10 | 1.8 × 10⁻⁶ | Al | 20 | 0 | 20 | 300 | 3 |
| Example11 | 2.6 × 10⁻⁶ | Al | 10 | 0 | 20 | 300 | 3 |
| Example12 | 9.3 × 10⁻⁶ | Al | 30 | 0 | 20 | 500 | 1.5 |
| Example13 | 9.6 × 10⁻⁶ | Al | 30 | 0 | 20 | 500 | 1.5 |
| Example14 | 9.6 × 10⁶ | Al | 30 | 0 | 20 | 500 | 1.5 |
| Example15 | 9.2 × 10⁻⁶ | Al | 30 | 0 | 20 | 500 | 1.5 |
| Example16 | 9.1 × 10⁻⁶ | Al | 30 | 0 | 20 | 500 | 1.5 |
| Example17 | 6.0 × 10⁻⁶ | Al | 30 | 0 | 20 | 500 | 1.5 |
| Example18* | 1.9 × 10⁻⁶ | Al | 20 | 0 | 20 | 300 | 3 |
| Example19* | 2.1 × 10⁻⁶ | Al | 20 | 12 | 28 | 300 | 3 |
| Example20* | 8.0 × 10⁻⁵ | Al | 20 | 0 | 20 | 300 | 3 |
| Example21* | 2.4 × 10⁻⁶ | Al | 200 | 0 | 20 | 300 | 3 |
| Example22* | 2.2 × 10⁻⁶ | Al | 20 | 0 | 20 | 300 | 3 |
| Example23* | 2.3 × 10⁻⁴ | Al | 30 | 0 | 20 | 300 | 1.5 |
| Example24* | 2.2 × 10⁻⁶ | Al | 0.05 | 0 | 20 | 300 | 1.5 |
| Example25* | 2.7 × 10⁻⁶ | Al | 30 | 0 | 20 | 300 | 1.5 |

Note 1)
"*"indicates COMPARATIVE EXAMPLE

TABLE 2

Film formation conditions of first nitride thin film (continuation)

| | Initial stage or later | | | | |
|---|---|---|---|---|---|
| | Sputtering energy Es(W/cm²Pa²) | Introduced gas Nitrogen (sccm) | Introduced gas Argon (sccm) | Substrate temperature (° C.) | Film thickness (nm) |
| Example1 | 5 | 3 | 17 | 750 | 47 |
| Example2 | 5 | 3 | 17 | 750 | 47 |
| Example3 | 5 | 3 | 17 | 750 | 47 |
| Example4 | 5 | 3 | 17 | 750 | 47 |
| Example5 | 5 | 3 | 17 | 500→750 | 3 + 44 |
| Example6 | 30 | 4 | 16 | 750 | 90 |
| Example7 | 20 | 3 | 17 | 500→750 | 3 + 44 |
| Example8 | 20 | 4 | 16 | 500→750 | 3 + 44 |
| Example9 | 20 | 6 | 14 | 500→750 | 3 + 44 |
| Example10 | 20 | 3 | 17 | 500→750 | 3 + 44 |
| Example11 | 10 | 3 | 17 | 500→750 | 3 + 44 |
| Example12 | 30 | 4 | 16 | 750 | 90 |
| Example13 | 30 | 4 | 16 | 750 | 90 |
| Example14 | 30 | 4 | 16 | 750 | 90 |
| Example15 | 30 | 4 | 16 | 750 | 45 |
| Example16 | 30 | 4 | 16 | 750 | 45 |
| Example17 | 30 | 4 | 16 | 750 | 90 |
| Example18* | 5 | 3 | 17 | 750 | 47 |
| Example19* | 5 | 3 | 17 | 750 | 47 |
| Example20* | 5 | 3 | 17 | 750 | 47 |
| Example21* | 200 | 3 | 17 | 750 | 47 |
| Example22* | 5 | 3 | 17 | 750 | 10 |
| Example23* | 30 | 4 | 16 | 750 | 90 |
| Example24* | 0.05 | 4 | 16 | 750 | 90 |
| Example25* | 30 | 4 | 16 | 750 | 90 |

Note 1)
"*"indicates COMPARATIVE EXAMPLE

TABLE 3

Film formation conditions of second nitride thin film

| | Target | Sputtering energy Es (W/cm²Pa²) | Introduced gas Nitrogen (sccm) | Introduced gas Argon (sccm) | Substrate temperature (° C.) | Film thickness (nm) |
|---|---|---|---|---|---|---|
| Example1 | GaN | 20 | 10 | 10 | 750 | 50 |
| Example2 | GaN | 20 | 6 | 14 | 750 | 50 |
| Example3 | GaN | 20 | 30 | 0 | 800 | 30 |
| Example4 | GaN | 20 | 10 | 10 | 750 | 30 |
| Example5 | GaN | 20 | 10 | 10 | 750 | 50 |
| Example6 | GaN | 32 | 4 | 16 | 750 | 70 |
| Example7 | GaN | 32 | 6 | 14 | 750 | 35 |
| Example8 | GaN | 32 | 6 | 14 | 750 | 35 |
| Example9 | GaN | 32 | 6 | 14 | 750 | 35 |
| Example10 | GaN | 32 | 6 | 14 | 750 | 35 |

TABLE 3-continued

Film formation conditions of second nitride thin film

| | Target | Sputtering energy Es (W/cm²Pa²) | Introduced gas Nitrogen (sccm) | Introduced gas Argon (sccm) | Substrate temperature (° C.) | Film thickness (nm) |
|---|---|---|---|---|---|---|
| Example11 | GaN | 32 | 6 | 14 | 750 | 35 |
| Example12 | GaN | 32 | 4 | 16 | 750 | 70 |
| Example13 | GaN | 32 | 4 | 16 | 750 | 70 |
| Example14 | GaN | 32 | 4 | 16 | 750 | 70 |
| Example15 | GaN | 32 | 4 | 16 | 750 | 135 |
| Example16 | GaN | 32 | 4 | 16 | 750 | 135 |
| Example17 | GaN | 32 | 4 | 16 | 750 | 70 |
| Example18* | GaN | 20 | 10 | 10 | 750 | 30 |
| Example19* | GaN | 20 | 10 | 10 | 750 | 30 |
| Example20* | GaN | 20 | 10 | 10 | 750 | 30 |
| Example21* | GaN | 200 | 10 | 10 | 750 | 30 |
| Example22* | GaN | 20 | 10 | 10 | 750 | 30 |
| Example23* | GaN | 32 | 4 | 16 | 750 | 70 |
| Example24* | GaN | 32 | 4 | 16 | 750 | 70 |
| Example25* | GaN | 0.03 | 4 | 16 | 750 | 70 |

Note 1)
"*" indicates COMPARATIVE EXAMPLE

TABLE 4

Evaluation results of multilayer film structure

| | Thickness of amorphous layer (nm) | Oxygen content note 2 (at %) | Silicon nitride content note 3 (at %) | Arithmetic average roughness Ra (nm) | Crystal phase, Polarity | FWHM (°) |
|---|---|---|---|---|---|---|
| Example1 | 0 | 4 | 3 | 0.91 | Hexagonal crystal, Ga-polarity | 0.84 |
| Example2 | 0 | 3 | 2 | 0.78 | Hexagonal crystal, Ga-polarity | 0.71 |
| Example3 | 0 | 3 | 3 | 0.81 | Hexagonal crystal, Ga-polarity | 0.95 |
| Example4 | 0.8 | 5 | 2 | 0.93 | Hexagonal crystal, Ga-polarity | 0.98 |
| Example5 | 0 | 2 | 2 | 0.71 | Hexagonal crystal, Ga-polarity | 0.071 |
| Example6 | 0.2 | 4 | 2 | 5.7 | Hexagonal crystal, Ga-polarity | 0.81 |
| Example7 | 0 | 3 | 3 | 2.2 | Hexagonal crystal, Ga-polarity | 0.062 |
| Example8 | 0 | 4 | 3 | 4.2 | Hexagonal crystal, Ga-polarity | 0.068 |
| Example9 | 0 | 2 | 2 | 4.3 | Hexagonal crystal, Ga-polarity | 0.062 |
| Example10 | 0 | 3 | 2 | 4.5 | Hexagonal crystal, Ga-polarity | 0.052 |
| Example11 | 0 | 5 | 2 | 4.5 | Hexagonal crystal, Ga-polarity | 0.71 |
| Example12 | 0 | 3 | 2 | 2.7 | Hexagonal crystal, Ga-polarity | 0.65 |
| Example13 | 0 | 2 | 3 | 4.6 | Hexagonal crystal, Ga-polarity | 0.78 |
| Example14 | 0.9 | 3 | 3 | 8.1 | Hexagonal crystal, Ga-polarity | 0.74 |
| Example15 | 0.2 | 4 | 2 | 7.5 | Hexagonal crystal, Ga-polarity | 0.60 |
| Example16 | 0.5 | 3 | 3 | 7.8 | Hexagonal crystal, Ga-polarity | 0.65 |
| Example17 | 0.1 | 2 | 3 | 5.4 | Hexagonal crystal, Ga-polarity | 0.80 |
| Example18* | 2.0 | 7 | 2 | 3.2 | Hexagonal crystal, Ga-polarity | 2.1 |
| Example19* | 2.0 | 3 | 9 | 2.8 | Hexagonal crystal, Ga-polarity | 2.3 |
| Example20* | 2.0 | 8 | 3 | 3.1 | Hexagonal crystal, Ga-polarity | 2.9 |
| Example21* | 0 | 3 | 3 | 2.1 | Hexagonal crystal, Ga-polarity | 1.9 |
| Example22* | 0 | 4 | 2 | 3.6 | Hexagonal crystal, Ga-polarity | 3.1 |
| Example23* | 1.0 | 10 | 4 | 11.4 | Hexagonal crystal, Ga-polarity | 2.0 |
| Example24* | 0.5 | 3 | 2 | 9.4 | Hexagonal crystal, Ga-polarity | 2.7 |

TABLE 4-continued

Evaluation results of multilayer film structure

| | Thickness of amorphous layer (nm) | Oxygen content [note 2] (at %) | Silicon nitride content [note 3] (at %) | Arithmetic average roughness Ra (nm) | Crystal phase, Polarity | FWHM (°) |
|---|---|---|---|---|---|---|
| Example25* | 0 | 3 | 3 | 14.2 | Hexagonal crystal, Ga-polarity | 3.2 |

Note 1)
"*"indicates COMPARATIVE EXAMPLE

[Note 2])
Oxygen content within 10 nm from Si surface/oxygen content within 10 nm from amorphous layer and Si surface

[Note 3])
Silicon nitride content within 10 nm from Si surface/Silicon nitride content within 10 nm from amorphous layer and Si surface

The invention claimed is:

1. A multilayer film structure comprising:
an Si (111) substrate;
a first thin film provided on the Si (111) substrate, and
a second thin film provided on the first thin film,
wherein the first thin film is an aluminum nitride thin film, and the second thin film is a gallium nitride thin film,
wherein the Si (111) substrate is provided with an amorphous layer thereon, the amorphous layer having a thickness of from 0 nm to less than 1.0 nm, and
wherein a full width at half maximum (FWHM) of a rocking curve of (0002) plane at a surface of the multilayer film structure is 1.50° or less.

2. The multilayer film structure according to claim 1, wherein the amorphous layer has a thickness of 0 nm, and the first thin film is in direct contact with the Si (111) substrate without interposing any other layer.

3. The multilayer film structure according to claim 2, wherein the content of oxygen within 10 nm from a surface of the Si (111) substrate is 5 at % or less.

4. The multilayer film structure according to claim 2, wherein the content of silicon nitride within 10 nm from a surface of the Si (111) substrate is 5 at % or less.

5. The multilayer film structure according to claim 1, wherein the amorphous layer has a thickness of from more than 0 nm to less than 1.0 nm.

6. The multilayer film structure according to claim 5, wherein the content of silicon nitride within 10 nm from a surface of the Si (111) substrate is 5 at % or less.

7. The multilayer film structure according to claim 1, wherein arithmetic average roughness (Ra) of a surface of the multilayer film structure is 10.0 nm or less.

8. The multilayer film structure according to claim 1, wherein the structure has an outermost surface comprising a hexagonal gallium nitride layer, and the gallium nitride layer has a surface having gallium (Ga) polarity.

9. A semiconductor element comprising the multilayer film structure of claim 1.

10. Electronic equipment comprising the semiconductor element of claim 9.

11. A method for producing the multilayer film structure according to claim 1, the method comprising:
preparing an Si (111) substrate;
immersing the Si (111) substrate in a cleaning liquid;
forming a first thin film by a sputtering method on the Si (111) substrate after immersion; and
forming a second thin film by a sputtering method on the first thin film,
wherein when the first thin film is formed, sputtering energy(Es) represented by the formula: Es=[Input power density (unit: W/cm$^2$)]/[Introduced gas pressure (unit: Pa)]$^2$ is from 0.1 W/cm$^2$Pa$^2$ to 150 W/cm$^2$Pa$^2$, and
when the second thin film is formed, sputtering energy (Es) represented by the formula: Es=[Input power density (unit: W/cm$^2$)]/[Introduced gas pressure (unit: Pa)]$^2$ is from 0.04 W/cm$^2$Pa$^2$ to 150 W/cm$^2$Pa$^2$.

12. The method according to claim 11, wherein when the first thin film is formed, the degree of vacuum in a deposition apparatus immediately before film formation is 1×10$^{-4}$ Pa or less.

13. The method according to claim 11, wherein when the first thin film is formed, argon gas is solely introduced into a deposition chamber to form a thin film having a film thickness of from 1 nm to 10 nm, and then gas comprising nitrogen is introduced into the deposition chamber to continue film formation.

14. The method according to claim 11, wherein a film thickness of the first thin film is at least 20 nm.

* * * * *